United States Patent [19]
Shu et al.

[11] Patent Number: 5,355,343
[45] Date of Patent: Oct. 11, 1994

[54] STATIC RANDOM ACCESS MEMORY WITH SELF TIMED BIT LINE EQUALIZATION

[76] Inventors: Lee-Lean Shu, 1096 November Dr., Cupertino, Calif. 95014; Chenming W. Tung, 2998 Ridgegate Dr., San Jose, Calif. 95133

[21] Appl. No.: 949,217

[22] Filed: Sep. 23, 1992

[51] Int. Cl.$^5$ ................................................ G11C 7/00
[52] U.S. Cl. .............................. 365/203; 365/189.11; 365/204; 365/233.5
[58] Field of Search ........... 365/202, 203, 204, 189.11, 365/233.5

[56] References Cited

U.S. PATENT DOCUMENTS

| | | | |
|---|---|---|---|
| 4,355,377 | 10/1982 | Sud et al. | 365/203 |
| 4,658,381 | 4/1982 | Reed et al. | 365/203 |
| 4,751,680 | 6/1988 | Wang et al. | 365/203 |
| 4,878,198 | 10/1989 | Roy | 365/222 |
| 5,036,492 | 6/1991 | Runaldue | 365/203 |

FOREIGN PATENT DOCUMENTS

| | | | |
|---|---|---|---|
| 54-152931 | 12/1969 | Japan | 365/203 |
| 2218092 | 8/1990 | Japan | 365/203 |

Primary Examiner—Eugene R. LaRoche
Assistant Examiner—Tan Nguyen
Attorney, Agent, or Firm—Hill, Steadman & Simpson

[57] ABSTRACT

A static memory array incorporates a bit line equalization transistor which is normally conductive so that the quiescent condition of the bit lines is to remain equalized. The equalization transistor is cut off for a predetermined period in response to detection of address transition. When a subsequent address transition occurs before the expiration of a predetermined period, the equalization transistor conducts again briefly, which conduction is followed by a period of nonconduction, for a predetermined duration, as long as another address transition is not detected. The equalization technique is applicable to local data lines as well as the bit lines of the memory.

8 Claims, 14 Drawing Sheets

STATIC RANDOM ACCESS MEMORY WITH SELF TIMED BIT LINE EQUALIZATION

FIELD OF THE INVENTION

The present invention relates to semiconductor memories and more specifically to high speed asynchronous CMOS SRAM memories.

BACKGROUND OF THE INVENTION

In a conventional static random access memory (SRAM) design, the bit lines are biased at the voltage level of $V_{CC}$, or nearly this level. In some designs, the bit lines have pull-up transistors of the PMOS type, which pull the bit line voltage to $V_{CC}$, and in other designs, a NMOS transistor is used for pull-up, in which case the bit lines are pulled up to $V_{CC}-V_{TM}$. The bit line pull-up transistors are gated by a signal which is active during the read cycle. In addition, a bit line equalization device, which is normally a PMOS transistor, is gated by a signal generated from an address transition detector circuit.

During pull down, the slew rate of the voltage level applied to the bit line with respect to time, is the quotient of the bit line current divided by the bit line capacitance. The bit line current is $$I_{CELL} - I_{BLPU}$$

where $I_{CELL}$ is the cell current, and $I_{BLPU}$ is the bit line pull-up current. It is apparent from this relationship that the slew rate can be made fast if the bit line pull-up current is low, with a higher $R_{ON}$, the ON resistance of the bit line pull up devices. However, the maximum difference in the voltage levels of the bit lines then becomes larger, which requires more time for bit line equalization, since $R_{ON}$, is greater. Accordingly, in conventional SRAM design, the bit line pull-up transistors are typically optimized so the total time of the bit line equalization and the bit line signal development time, combined, is a minimum.

SUMMARY OF THE INVENTION

It is a principal object of the present invention to provide an arrangement for a high speed static asynchronous semiconductor random access memory in which performance is increased by providing faster access for reading and writing.

It is another object of the present invention to provide an arrangement for a random access memory which makes it unnecessary to provide pull-up for the bit line during reading.

It is a further object of the present invention to provide an arrangement for such a memory which is characterized by a lower maximum voltage difference between the bit lines.

It is another object of the present invention to provided such a memory in which there is less time required for the period in which the bit lines are not equalized.

It is a further object of the present invention to provide such a memory in which access times are improved because less time is required for bit line equalization.

It is another object of the present invention to provide such a memory in which the same techniques are applied to the data lines of the memory.

These and other objects and advantages of the present invention will become apparent by inspection of the following description and the accompanying drawings.

BRIEF DESCRIPTION OF THE DRAWINGS

Reference will now be made to the accompanying drawings in which:

Referring to FIG. 1, a conventional static random access memory is illustrated. The memory is typically divided into segments or sectors along the direction of the word lines, so that only a part of the memory is made operative at any one time, in order to conserve power. In the arrangement illustrated in FIG. 1, two such sections are illustrated, each having a plurality of cells distributed along the bit lines. The cells of only one pair of bit lines are operative at any given time for reading and writing. Transistors M1 and M2 are pull-up transistors, for pulling up both sides of the bit line pair to the voltage level $V_{CC}$. The transistor M3 is an equalization transistor, for short circuiting the bit lines to insure that both sides of the bit lines have an equal voltage level at the appropriate times. The normal operation of such circuit is illustrated in the waveforms of FIG. 2. When the address is set up, a signal ATDB is produced, indicating a transition in the signals on the address bus. This is used to generate the bit line equalization signal BLEQ, which is applied to the transistor M3, so that the voltage differential between the two bit lines, illustrated in FIG. 2 as BL/BLB, is brought to zero prior to reading of the data from the memory. The period during which the bit line equalization is effective is labelled in FIG. 2 as period 2. Period 1 precedes it and represents the state of the memory after a prior sensing has been completed, and before the ATDB signal. Period 3, which begins at the end of the BLEQ signal is the period during which the memory content is sensed. A further period 1 follows period 3, as illustrated in FIG. 2.

Figure 2:
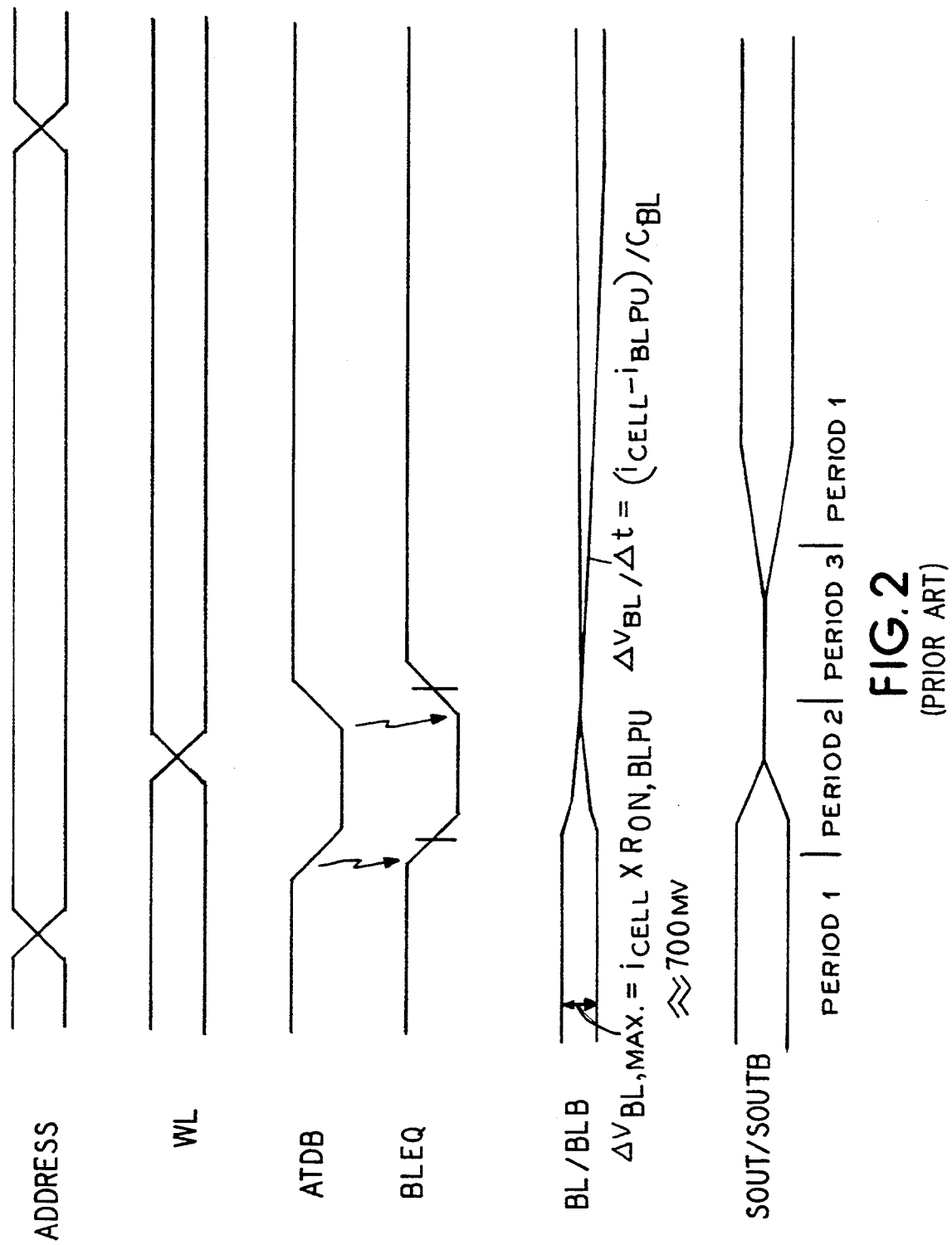
FIG. 2 is a diagram of waveforms occurring during operation of the memory of FIG. 1.

The maximum bit line differential voltage $\Delta V_{L,MAX}$ is equal to the voltage drop across M1 or M2, the bit line pull-up transistors.

$$\Delta V_{BL,MAX} = I_{CELL} \times R_{ON,BLPU}$$

where $R_{ON, BLPU}$ is the on resistance of the BLPU devices. As shown in FIG. 2, the word line signal WL is making a transition while the bit lines are equalizing. After the BLEQ signal goes up, cutting off M3, bit lines are pulled down during reading by $$I_{CBL} = I_{CELL} - I_{BLPU}.$$

The slew rate of the bit line signal $\Delta V_{BL}/\Delta T$ is $$\Delta V_{BL}/\Delta T = I_{CBL}/C_{BL} = (I_{CELL} - I_{BLPU})/C_{BL}.$$

If the transistors M1 and M2 are weak, so that there is a relatively small $I_{BLPU}$, then the slew rate can be fast, as seen from the above expression. However, the maximum $\Delta V_{VL}$ then becomes larger, so that there is more time required for bit line equalization. Accordingly, in conventional SRAM design, the pull-up devices M1 and M2 need to be optimized such that the total time required for bit line equalization (period 2) and the sensing interval (period 3), combined, is a minimum.

Figure 1:
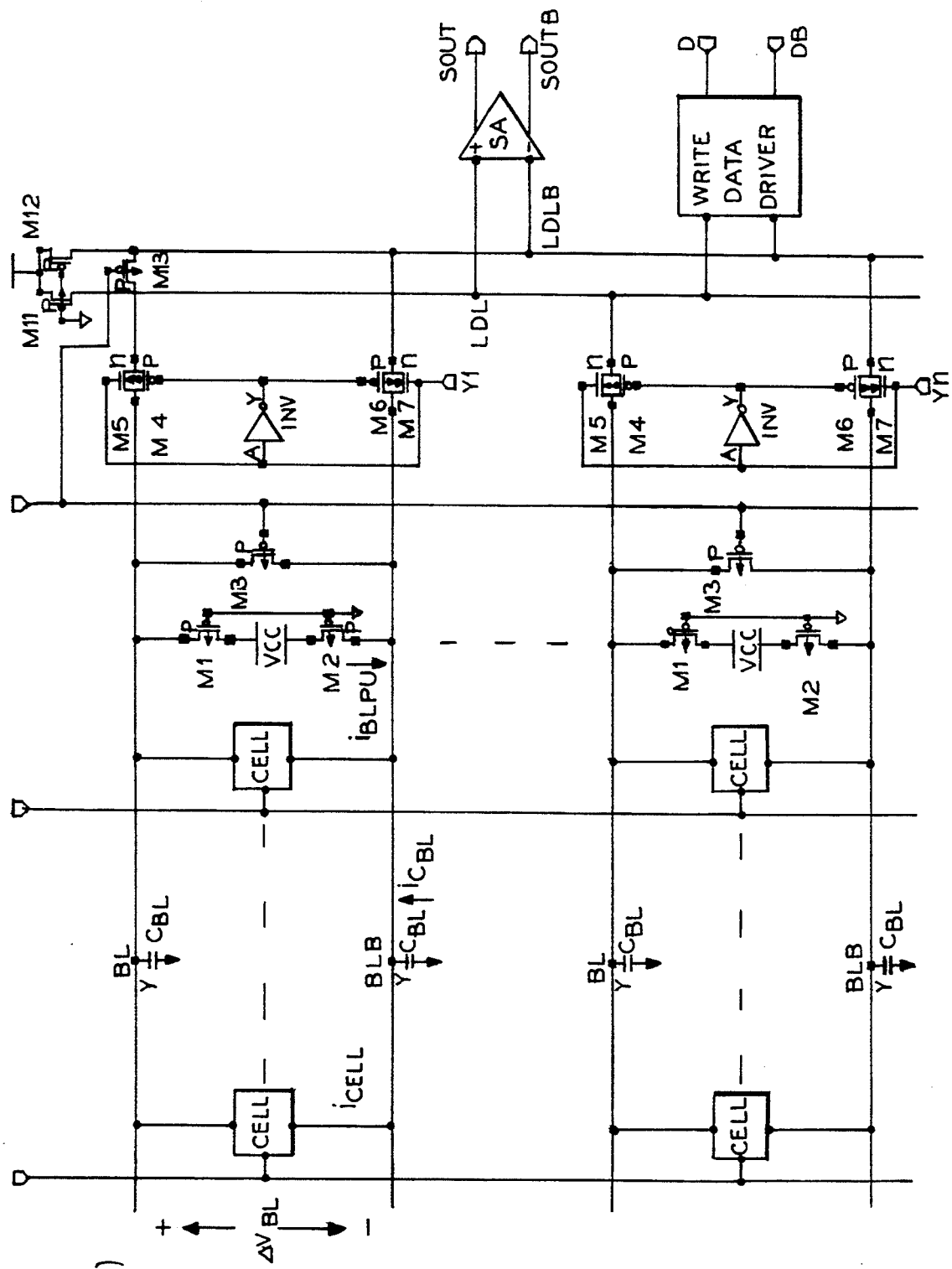
FIG. 1 is a schematic diagram of a conventional static random access memory.
Figure 3:
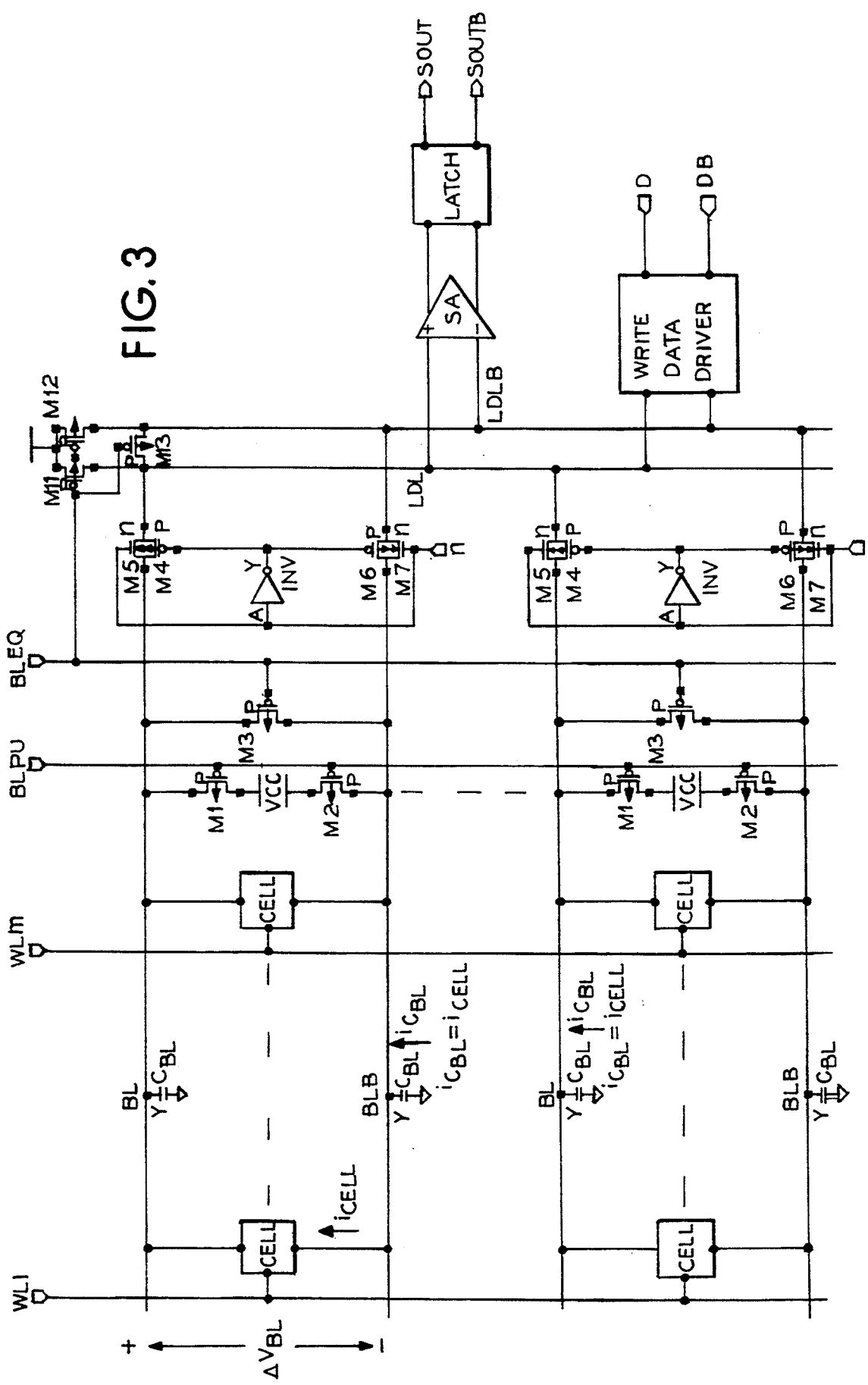
FIG. 3 is a schematic diagram of an improved memory incorporating an illustrative embodiment of the present invention.
Figure 4:
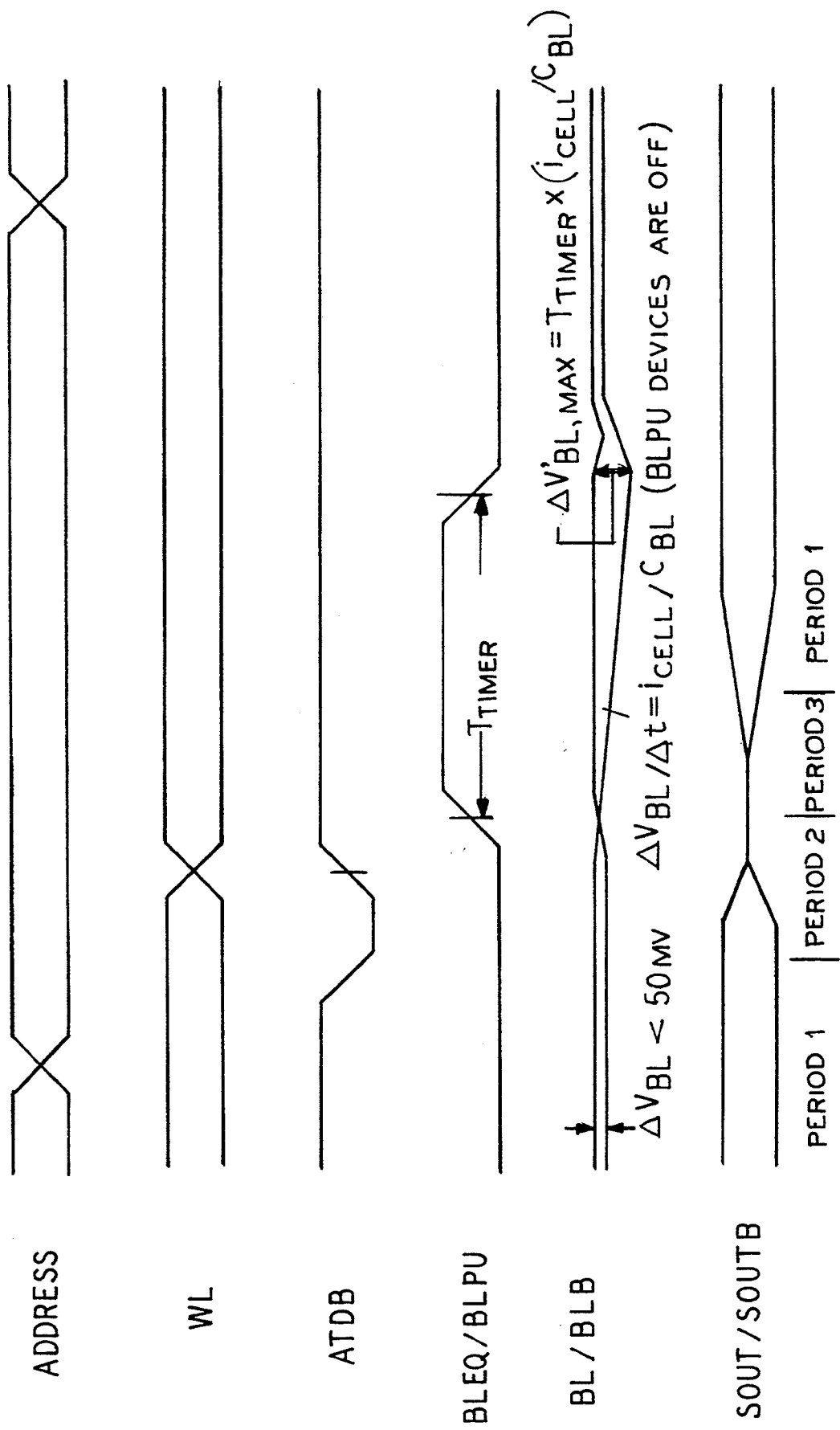
FIG. 4 is a group of waveforms illustrating operation of the apparatus of FIG. 3.

Referring to FIGS. 3 and 4, an illustrative embodiment of the present invention is shown. The bit line pull-up transistors M1 and M2 are gated by BLPU, and the equalization transistor M3 is gated by a modified signal BLEQ. During a read operation, the BLPU signal and the BLEQ signals are identical, cutting off M1-M3. Unlike the conventional circuit illustrated in FIG. 1, the bit lines are equalized before the address makes a transition. The equalization transistor M3 is on during its steady state condition, prior to reading, due to the low level of BLEQ (FIG. 4.). Hence the bit line difference $\Delta V_{BL}$ can be very small, i.e., less than 50 mV, compared to approximately 700 mV in a conventional memory. As soon as the word line WL makes a transition (FIG. 4), the BLEQ clock transitions from low to high, to cut off the equalization transistor M3, and the BLPU clock disables the pull-up transistors M1 and M2, so that the bit lines are discharged by the cell current only. Therefore, the slew rate of the bit line signal $\Delta V_{BL}/\Delta T$ is increased:

$$\Delta V_{BL}/\Delta T = I_{CELL}/C_{BL}$$

The BLEQ and BLPU clocks are self-timed, such that both go low after sensing is completed. After sensing is completed, the bit lines are equalized rapidly, since $\Delta V_{BL}$ is less, and pulled up again while waiting for the next access.

By use of the present invention, the time required for read operation of the SRAM is reduced in two respects. Firstly, because the bit lines are pre-equalized before the word line transition, the bit line equalization time is not limited by the equalization of the maximum value of $\Delta V_{BL}$. Instead, it is limited only by the address skew cycle, as described hereinafter. However, in the address skew cycle, the maximum differential voltage in the bit lines $\Delta V_{BL}$, is smaller than that of the conventional memory, namely, about 200 millivolts as compared with 700 millivolts. Secondly, the sensing is accomplished more rapidly, due to a faster bit line slew rate because the bit line pull-up devices are cut off during sensing, the bit line differential voltage is controlled solely by the cell current $I_{CELL}$, and the effective amount of this current is not reduced by the $I_{BLPU}$, as in the conventional arrangement.

Since the bit lines are pulled up in their quiescent state, the time during which they are discharged from this level is limited to the sensing period during reading operations. Thus, the difference in voltage level between members of a bit lie pair is limited to the value determined by the slew rate over this short time interval. Also, because the maximum differential bit line voltage is limited, a shorter time is needed (between sensing periods) for bit line equalization.

Figure 5:
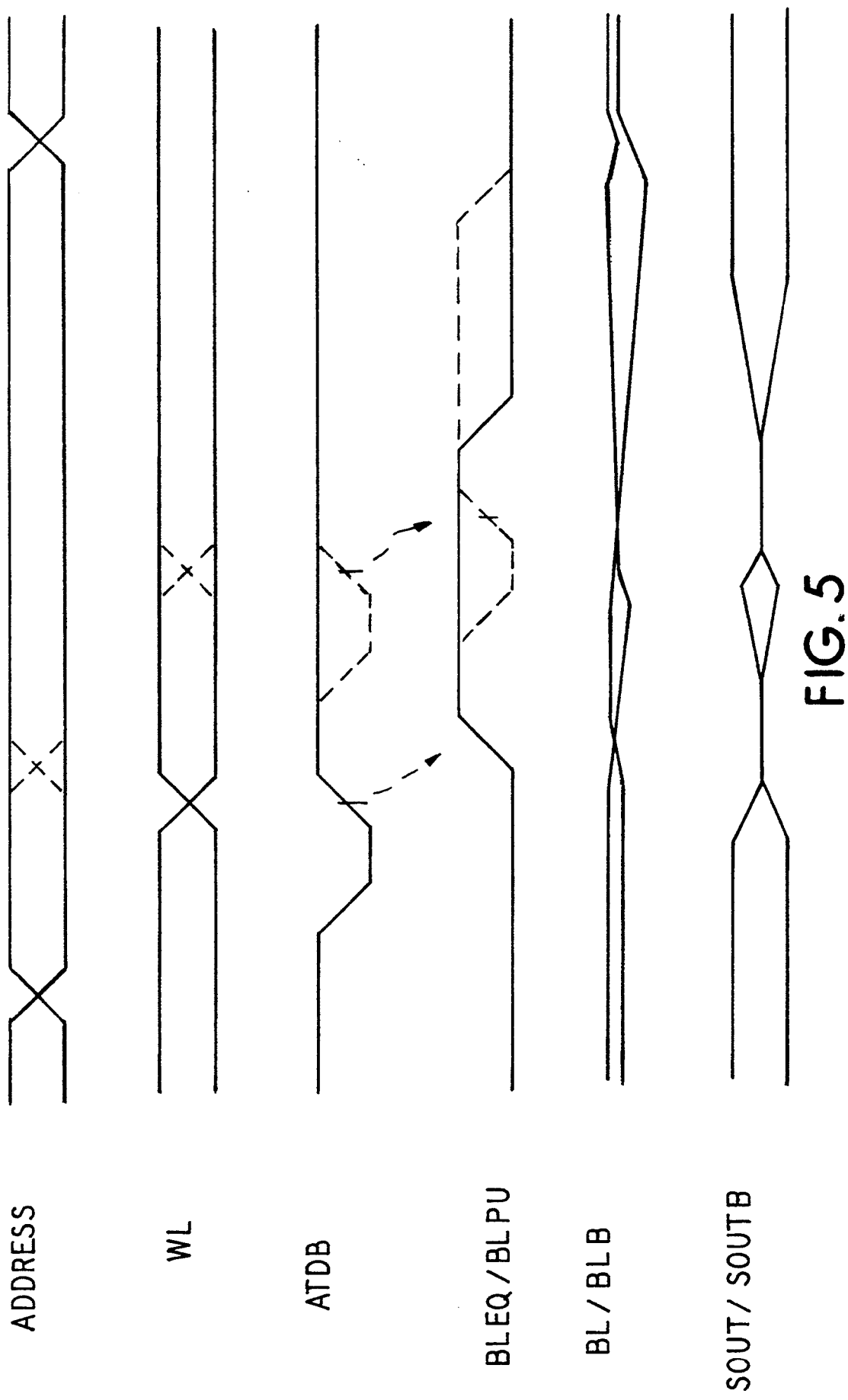
FIG. 5 is a series of waveforms illustrating the operation of FIG. 3 in conditions of address skew cycles.
Figure 6:
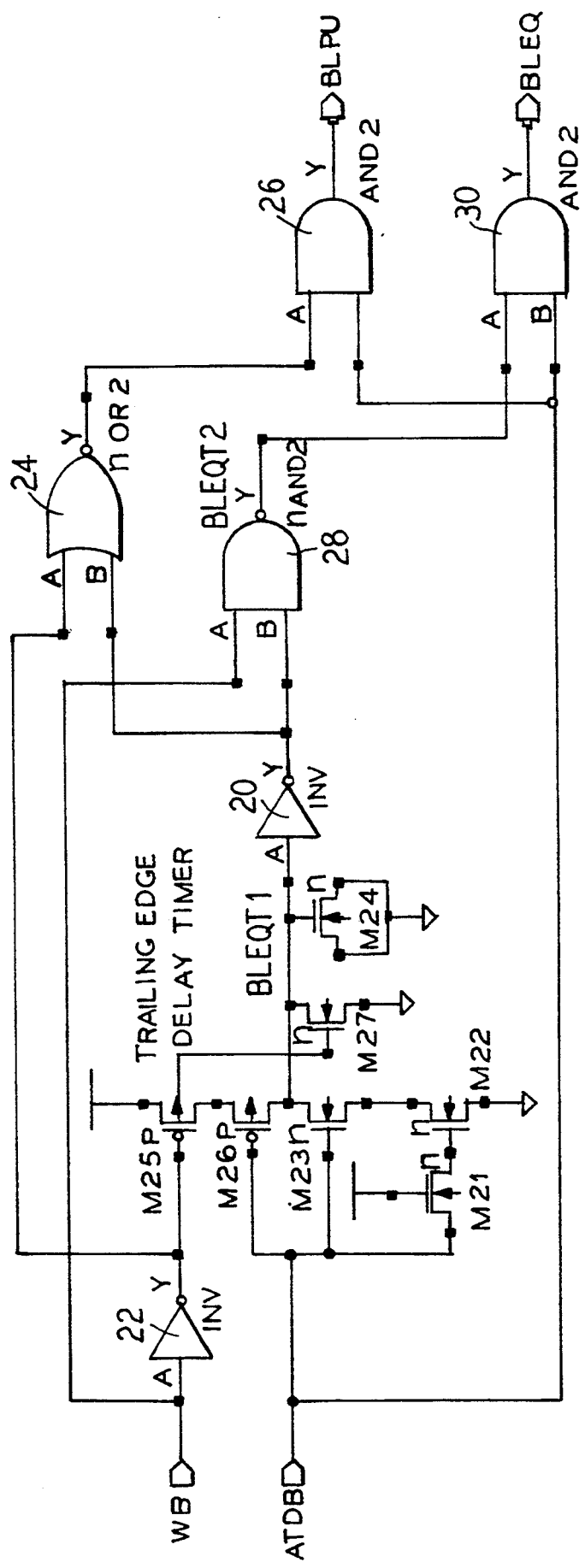
FIG. 6 is a schematic diagram of a circuit for developing clock signals used by the apparatus of FIG. 3.
Figure 7:
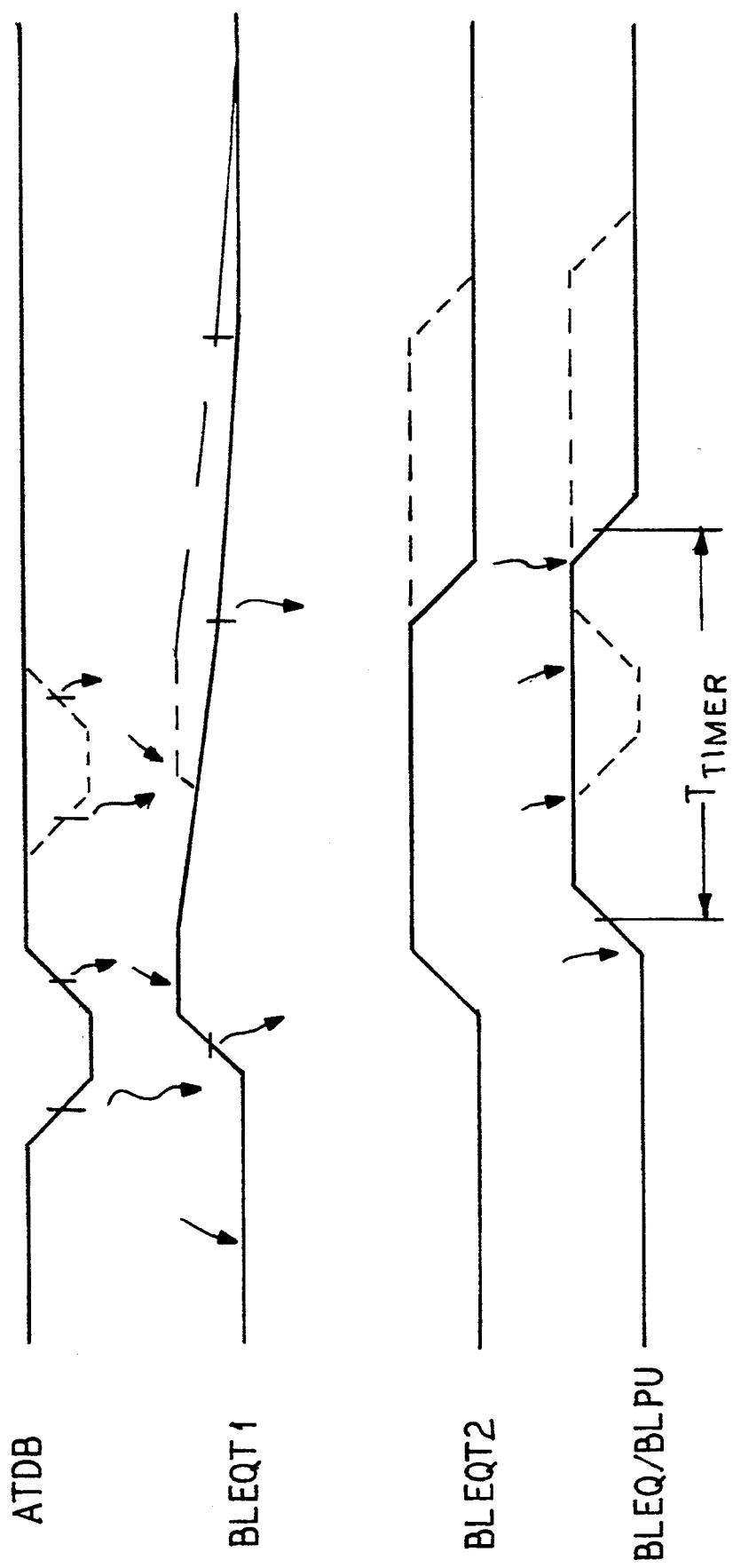
FIG. 7 is a series of waveforms illustrating operation of an alternative embodiment of the present invention.

In a practical memory, the SRAM must operate asynchronously, so BLEQ and BLPU clocks need to be able to respond to an address skew cycle. In other words, the address can make several transitions in the course of a normal cycle. FIG. 5 shows waveforms occurring during an address skew cycle. FIG. 6 shows a schematic circuit diagram for developing the BLPU and BLEQ clocks at the appropriate times to accommodate the operation of FIG. 5. FIG. 7 illustrates waveforms occurring during operation of the apparatus of FIG. 6. As illustrated in FIG. 5, the voltage level on the line for the BLEQ/BLPU signal is normally low, but goes high in response to a low ATDB signal, indicating an address transition. The BLEQ/BLPU signal normally times out during the course of the reading access, and again goes low, to resume its steady state. However, when there is another address transition occurring prior to the time out of the BLEQ/BLPU signal, it is necessary to drive the BLEQ/BLPU signal low again, briefly, in order to equalize the bit lines. This is illustrated in FIG. 5 by the dashed lines showing a second ATDB pulse, and the corresponding low level on the BLEQ/BLPU line, with a dashed line also showing an extended time before the level on the BLEQ/BLPU line goes low again. In FIG. 5, the line BL/BLB, which illustrates the differential bit line voltage, shows that it is substantially equalized on a steady state basis, allowed to change when BLEQ/BLPU first goes high and is again equalized when the second ATDB pulse occurs. When the second ATDB pulse ends, the differential bit line voltage shown on line BL/BLB increases (during the sensing period), and the bit lines are again equalized when BLEQ/BLPU goes low. The bottom line labeled SOUT/SOUTB illustrates the readout of the memory. A first output is made available briefly, after the initial address change, and then a steady state output is produced when the address signals become stable.

FIG. 6 illustrates the circuit by which the BLEQ and BLPU signals are developed at the proper times. The ATDB signal is supplied to the gate of a transistor M26, while the WB signal is transferred through an inverter 22 to the gate of transistor M25. The two transistors M25 and M26 are connected in series between a terminal $V_{CC}$, and a line 23, on which the BLEQT1 signal appears, and is supplied to the input of an inverter 20. The two transistors M25 and M26 function as a logical NOR gate so that the level on BLEQT1 is low if the gate of M25 is high or the gate of M26 is high. If both gates are low, both transistors conduct and BLEQT1 rises quickly to the $V_{CC}$ level.

The gate of the M25 transistor is connected to the WB signal through an inverter 22. WB is high during a read cycle and low during a write cycle, so that during a read cycle, the gate of transistor M25 is always low. Accordingly, BLEQT1 goes high when a low signal appears on ATDB, and the output of the inverter 20 thereupon goes low. FIG. 7 shows the waveforms.

A NOR gate 24 has one input connected with the output of the inverter 22, and the other input connected to the output of the inverter 20, so that when both inputs go low during a read cycle with the ATDB pulse, the output of the NOR gate 24 goes high. One input of an AND gate 26 is connected to the output of the NOR gate 24, and the other input is connected to the ATDB terminal. Its output produces the BLPU signal. The BLPU signal from the AND gate 26 remains low until the ATDB pulse returns to a high level, after which the AND gate 26 produces a high level output for the BLPU signal. When ATDB returns high, the transistor M26 is cut off, allowing the level on BLEQ T1 to go low gradually, until it reaches the threshold level of the inverter 20, which then goes high. This brings the output of the NOR gate 24 low and ends the BLPU pulse.

A transistor M24 simulates a capacitor on the BLEQT1 line, which delays the change in voltage level on this line, and supplies the time constant for the timer, which is made up of M21-M27. The transistor M27 is open during the read cycle, because the output of the invertor 22 is low. However, the transistors M22 and M23 are connected in series between the line BLEQT1 and ground, and function to discharge the capacitor M24, when ATDB is high, by allowing a small value of current to flow to ground. The transistor M23 is conductive when ATDB is high, because its gate is connected directly thereto, and the transistor M22 has its gate connected to ATDB through a transistor M21. Thus, the gate of the transistor M22 is also high when the ATDB signal is high, but the transistor M22 is turned on only weakly, because of the presence of M21 in its gate circuit.

The combination of the transistors M21 and M22 simulate a four transistor or 4T SRAM memory cell, and also determines the time constant of the timer, so that the bit line slew rate is accurately tracked exactly. The transistors M22 and M23 function effectively as the R of an RC timer, and the transistor M24 supplies the C of the RC time constant.

A further NAND gate 28 has one input connected to the WB line, and the other input connected to the output of the inverter 20. The BLEQT2 signal is produced at its output. Since WB is high during the read cycle, BLEQT2 is high while BLEQT1 is high. When the BLEQT1 signal falls below the threshold value of the invertor 20, however, the second input of the NAND gate goes low, so that it produces a high output signal, as shown in FIG. 6. This is connected to one input of an AND gate 30, the other input of which is connected to the ATDB terminal directly. The signal BLEQ produced at the output of the AND gate 30, is produced at the same time as the BLPU signal, during the read cycle.

During the write cycle, the level on the WB line is low, so that one input of the NAND gate 28 remains low, so its output is high and the BLEQ signal output of the AND gate 30 tracks the ATDB signal. The output of the inverter 22, however, is high, causing the output of the NOR gate 24 to be low. Therefore, the output of the AND gate 26 is low during the write cycle. Thus the pull-up transistors M1 and M2 conduct continuously during the write cycle, but the equalization transistor M3 remains cut off except during the ATDB pulse.

Figure 8:
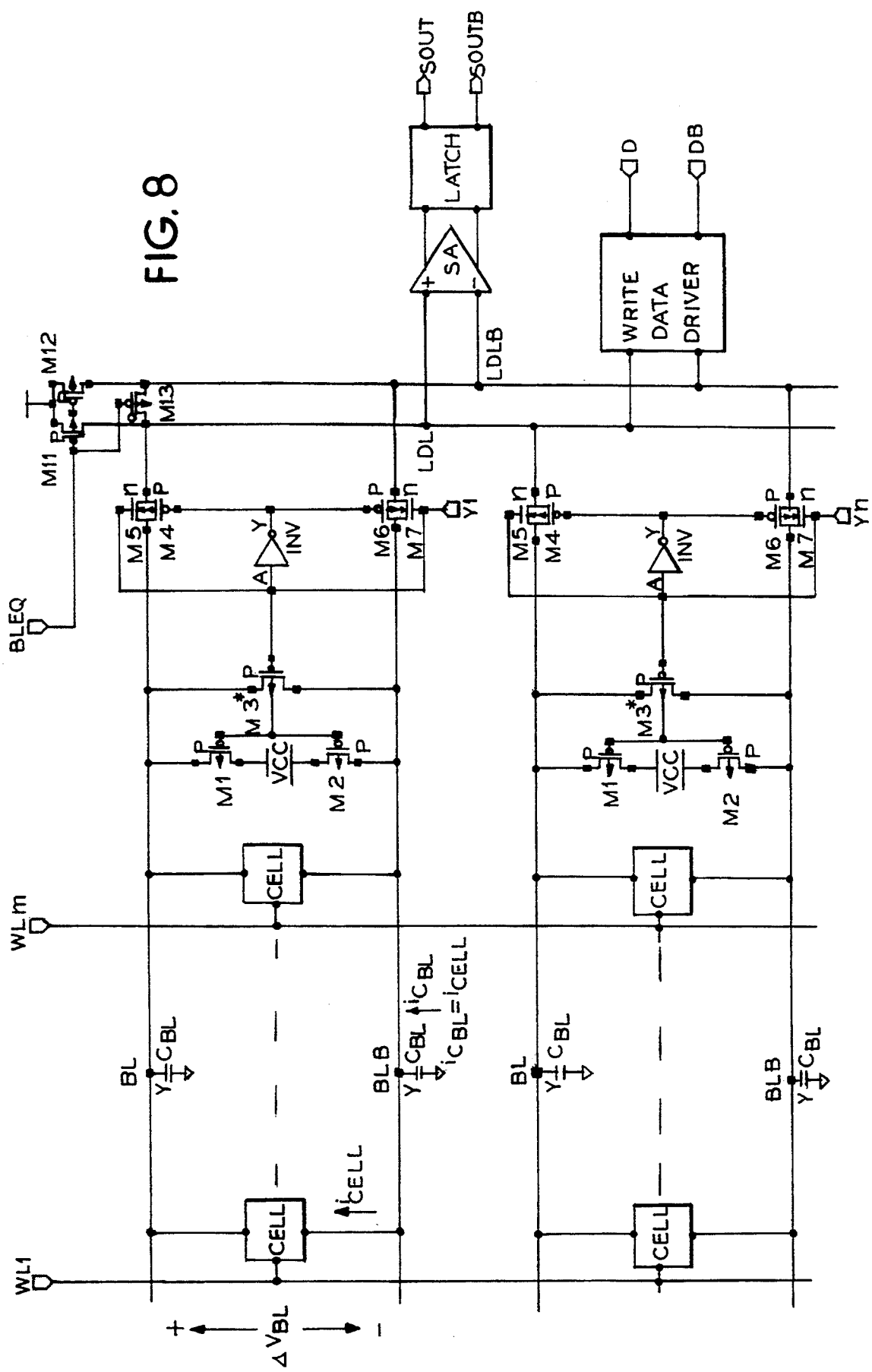
FIG. 8 is a schematic diagram of a static random access memory incorporating an alternative embodiment of the present invention.

FIG. 8 illustrates a modified arrangement of a SRAM incorporating an embodiment of the present invention. In this case, bit line pull-up transistors M1 and M2 are both gated by the signal Yn which selects one of the memory sections. Nonselected sections maintain the pull-up transistors M1 and M2 and the equalization transistor M3 conductive. These transistors are cut off in the selected section, and the Y pass transistors M4-M7 connect the bit lines of the selected section to the local data lines LDL and LDLB. An equalization transistor M13 is connected across the local data lines, and transistors M11 and M12 function as pull-up devices for pulling up the two sides of the local data lines to the $V_{CC}$ level. The gates of all three transistors M11-M13 are connected to receive the BLEQ signal, so that equalization and pull-up of the data lines occurs, for the selected memory section, in the same fashion which has been described above in connection with the bit lines. The BLEQ clock remains high to cut off the transistors M11-M13 during the write cycle.

Figure 9:
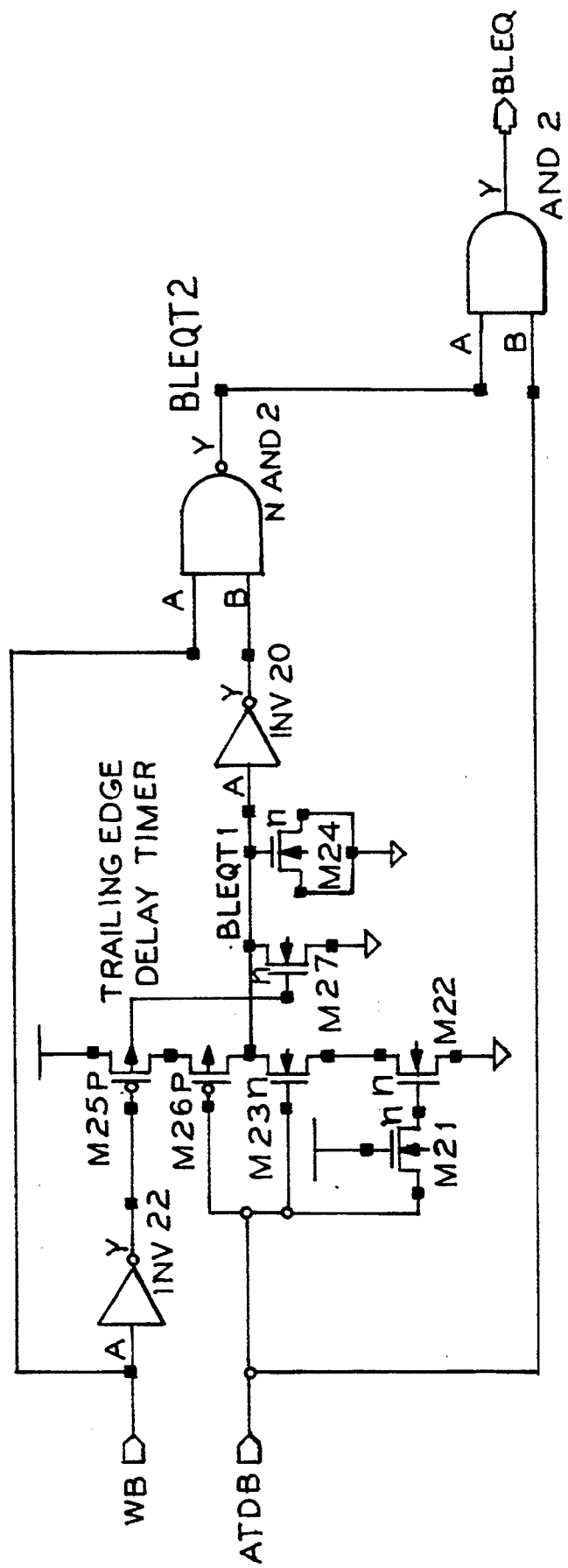
FIG. 9 is a schematic circuit diagram of apparatus for generating clock signals used in the circuit of FIG. 8.

FIG. 9 is a schematic diagram of the circuit for producing the BLEQ signal required for the SRAM of FIG. 8. It differs from FIG. 6 in that there is no need for the BLPU clock and so the circuit including gates 24 and 26 for generating that signal has been omitted. Otherwise, the circuit of FIG. 9 is the same as that of FIG. 6.

Figure 10:
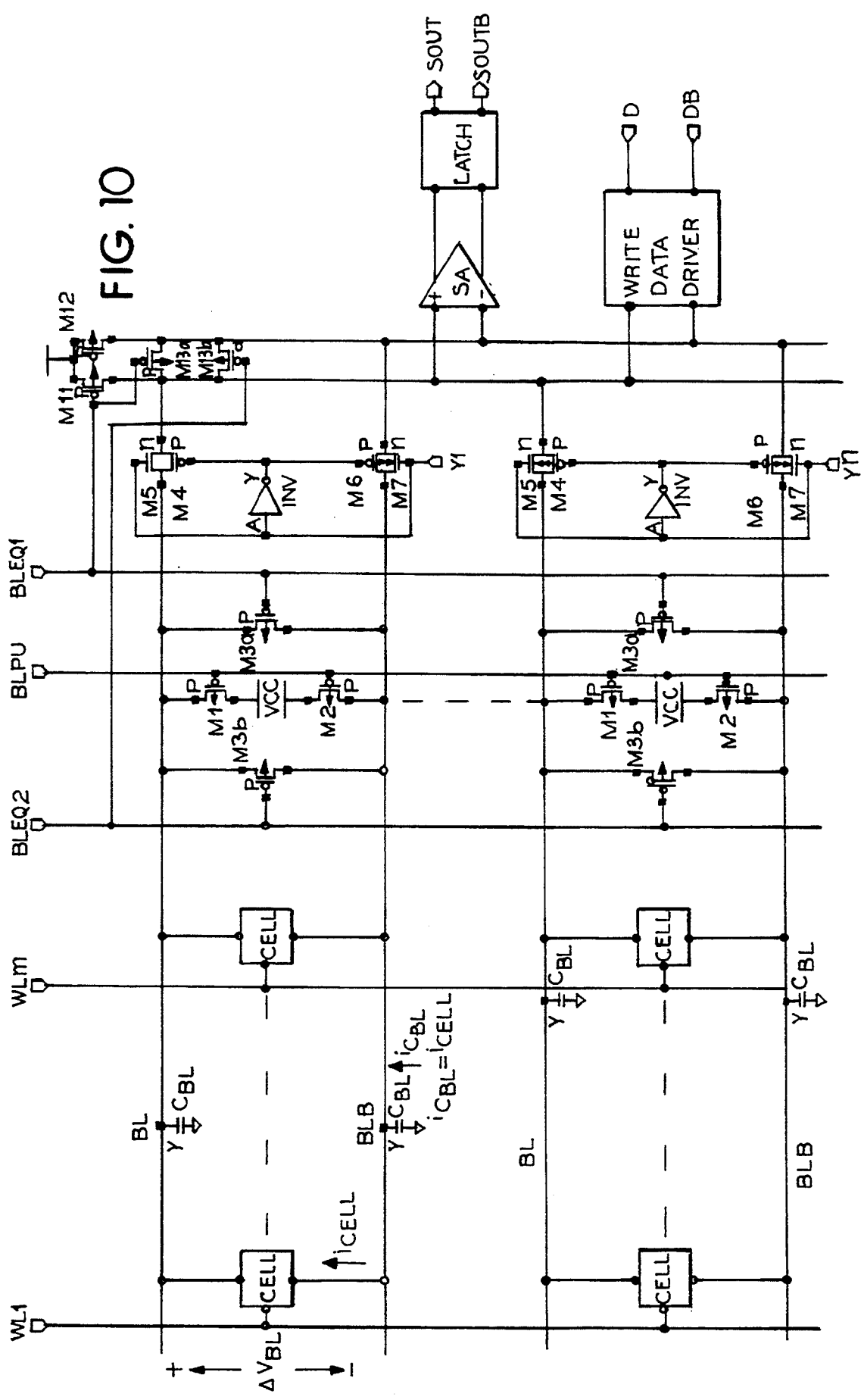
FIG. 10 is a schematic circuit diagram of a further static random access memory incorporating another embodiment of the present invention.
Figure 11:
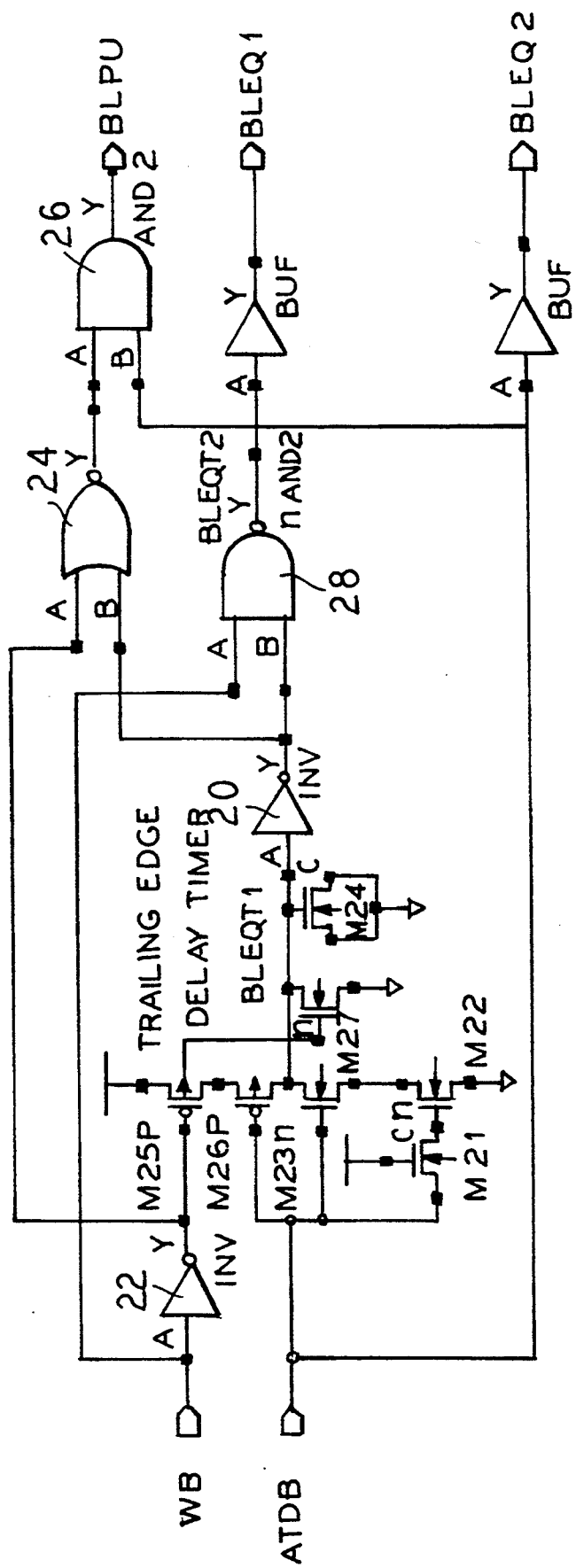
FIG. 11 is a schematic circuit diagram illustrating a circuit for developing clock signals required for the operation of the circuit of FIG. 10.

FIG. 10 shows an alternative arrangement of the present invention, in which two equalization transistors M3A and M3B are provided for each bit line, and two equalization transistors M13A and M13B are provided for the local data lines. Each pull-up transistor of every equalization pair is provided with an individual gate signal either BLEQ1 or BLEQ2. FIG. 11 is a circuit diagram illustrating the generation of the two gate signals BLEQ1 and BLEQ2, as well as the BLPU signal, which is connected to the gates of the bit line pull-up transistors M1 and M2. The data line pull-up transistors M11 and M12 are gated by the BLEQ1 signal.

Figure 12:
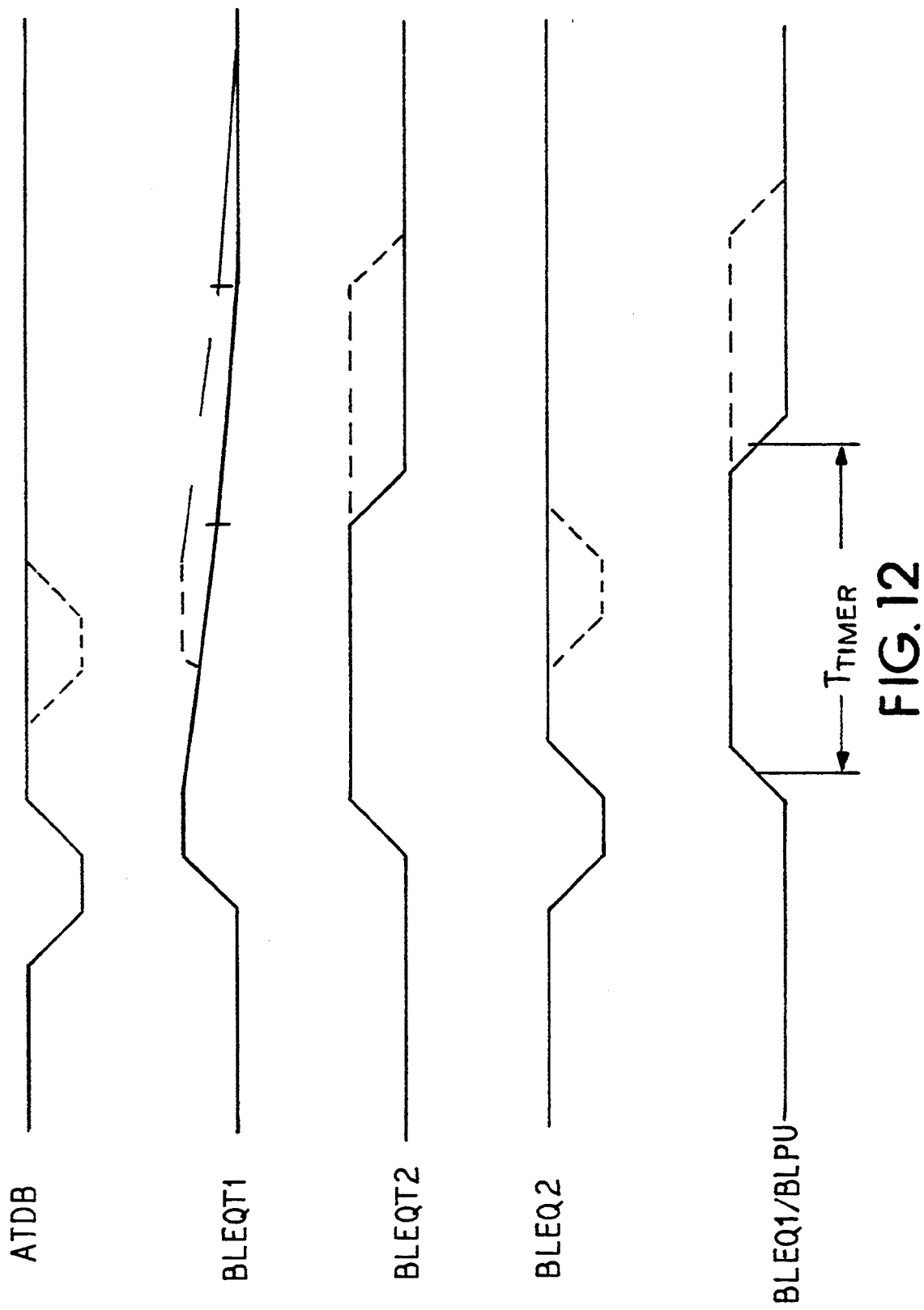
FIG. 12 is a series of waveforms illustrating operation of the apparatus of FIG. 10.

FIG. 11 shows a circuit diagram for generating the clock signals which are required for the arrangement of FIG. 10. The transistors M21-M27, and the inverters 20 and 22, are identical to the corresponding components of FIG. 6. The gates 24 and 26, which generate the BLPU signal, are also identical to those in FIG. 6. The gate 28 has the same inputs as the gate 28 of FIG. 6, but its output is connected through a buffer 32 to provide a clock signal identified as BLEQ1, while the ATDB signal is passed through a buffer 34 to provide the clock signal BLEQ2. The transistor pair M3A and M3B are driven respectively with BLEQ1 and BLEQ2, thereby eliminating the need for the AND gate corresponding to the AND gate 30 of FIG. 6. The transistor pair M13A and M13B are also driven individually by the clock signals BLEQ1 and BLEQ2. The BLEQ1 signal is controlled by the timer, made up of transistors M21-M24 and M27, while the BLEQ2 signal provides equalization for an address skew cycle, in which a new address transition occurs before the end of the normal time out, as described above. FIG. 12 illustrates the waveforms of the signals.

Figure 13:
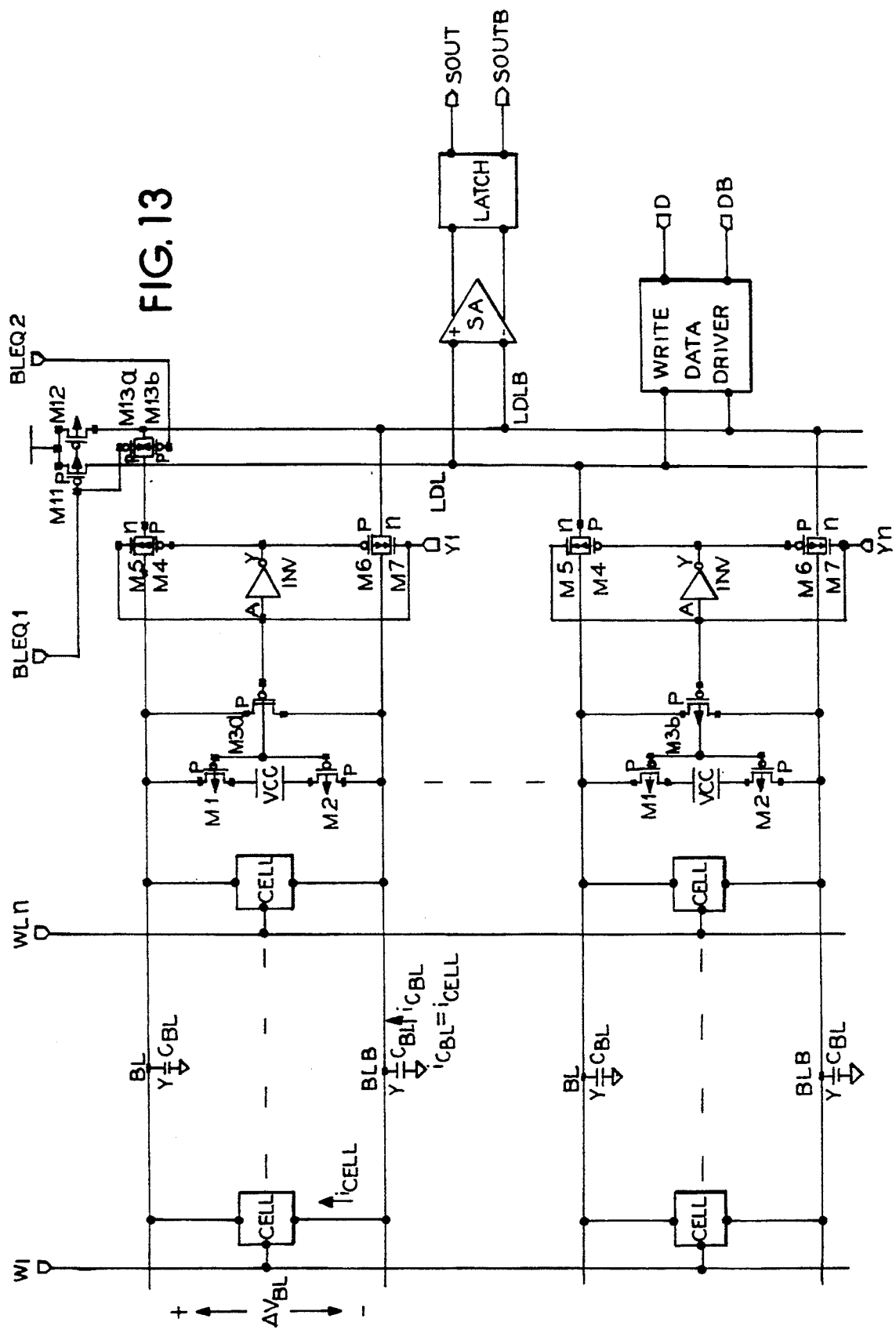
FIG. 13 is a schematic diagram of a further embodiment of the present invention.
Figure 14:
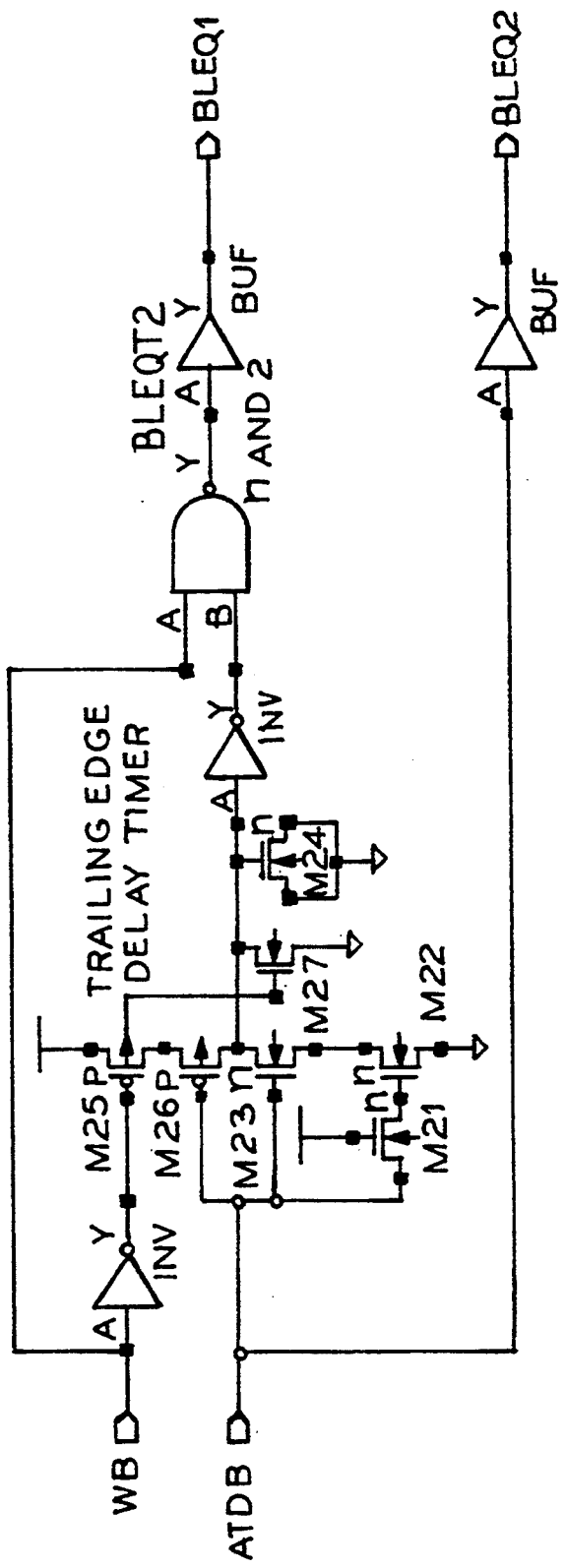
FIG. 14 is a schematic diagram of a circuit for developing clock signals required in the operation of the apparatus of FIG. 13.

FIG. 13 illustrates an arrangement in which the equalization and pull-up transistors on the local data lines are driven by the signals BLEQ1 and BLEQ2. The equalization transistor M3A for the bit line, as well as the pull-up transistors M1 and M2, are driven by the decoded $Y_N$ signals, as described in connection with FIG. 8. FIG. 14 shows a circuit diagram for generating the BLEQ1 and BLEQ2 signals required by the circuit of FIG. 13. It corresponds to FIG. 11, except that the circuitry for generating the BLPU is omitted, since the BLPU signal is not needed.

It will be apparent that various modifications and additions may be made in the apparatus of the present invention without departing from the essential features of novelty thereof, which are intended to be defined and secured by the appended claims. For example, the ATDB, BLEQ, and BLPU clocks described above can be local clocks which are active only within an enables section or block of the memory. Since it is common to divide the memory into sections or blocks along the word line, for the purpose of reducing power consumption, the clock signals described above can also be localized, so that they are provided only for the active block. In this way, the total length of the signal lines can be reduced, with a corresponding reduction in capacitive loading. Thus, each block would have a gate for controlling ATDB, BLPU, and the various BLEQ signals so they are provided only to the memory segment that is currently active.

What is claimed is:

1. In a static random access memory, having a plurality of memory cells, a plurality of word lines and a plurality of bit line pairs connected with said cells, means for equalizing said bit lines comprising an equalization transistor connected across at least one bit line pair, means for causing said equalization transistor to conduct, and means responsive to detection of an address transition for cutting off said equalization transistor for a predetermined period of time, further including means for causing said equalization transistor to conduct briefly in response to detection of a subsequent address transition signal before said predetermined time has expired.

2. Apparatus according to claim 1, including at least one pull-up transistor connected between one of said bit line pairs and a source of potential, means for causing said pull-up transistor to conduct, and means responsive to detection of an address transition for cutting off said pull-up transistor for a predetermined period of time.

3. Apparatus according to claim 1, wherein said means for equalizing said bit lines comprises a pair of equalization transistors connected in parallel across said bit line pair.

4. Apparatus according to claim 1, including timer means for establishing said predetermined period of time in accordance with the access time characteristics of the memory cells in said memory.

5. In a static memory having a plurality of memory cells defined by word lines and bit lines, and a pair of local data lines for manifesting data which is written to or read from said memory cells, an equalization circuit for said data lines comprising an equalization transistor connected between said two local data lines, means for causing said equalization transistor to conduct, and means operative in response to detection of an address transition for cutting off said transistor for a predetermined period of time.

6. Apparatus according to claim 5, including means responsive to detection of a subsequent address transition, prior to the expiration of said predetermined time, for again causing said transistor to conduct.

7. Apparatus according to claim 5, including a bit line equalization transistor connected across a pair of bit lines, means causing said equalization transistor to normally conduct, means for selectively enabling one group of said memory cells for reading or writing, and means responsive to selection of a given group of memory cells for reading or writing for cutting off said bit line equalization transistor.

8. Apparatus according to claim 5, including at least one pull-up transistor connected between a bit line and a source of potential, means causing said pull-up transistor to normally conduct, means for selectively enabling one group of said memory cess for reading or writing, and means responsive to selection of a given group of memory cells for reading or wiring for cutting off said pull-up transistor.

* * * * *